United States Patent
Shibata

(10) Patent No.: US 9,231,369 B2
(45) Date of Patent: Jan. 5, 2016

(54) METHOD FOR CONTROLLING WAVELENGTH TUNABLE LASER

(71) Applicant: Sumitomo Electric Device Innovations, Inc., Yokohama-shi (JP)

(72) Inventor: Masao Shibata, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/528,946

(22) Filed: Oct. 30, 2014

(65) Prior Publication Data

US 2015/0117482 A1  Apr. 30, 2015

(30) Foreign Application Priority Data

Oct. 31, 2013  (JP) .................................. 2013-227589
Oct. 31, 2013  (JP) .................................. 2013-227590

(51) Int. Cl.
| | |
|---|---|
| *H01S 5/026* | (2006.01) |
| *H01S 5/06* | (2006.01) |
| *H01S 5/0625* | (2006.01) |
| *H01S 5/068* | (2006.01) |
| *H01S 3/102* | (2006.01) |
| *H01S 3/106* | (2006.01) |

(52) U.S. Cl.
CPC ............. *H01S 5/0261* (2013.01); *H01S 5/0612* (2013.01); *H01S 5/0617* (2013.01); *H01S 5/06256* (2013.01); *H01S 5/06258* (2013.01); *H01S 5/06804* (2013.01); *H01S 3/1028* (2013.01); *H01S 3/1062* (2013.01)

(58) Field of Classification Search
CPC ... H01S 5/026; H01S 3/1003; H01S 3/10015; H01S 3/1028; H01S 3/1062; H01S 5/0612; H01S 5/0617; H01S 5/0652; H01S 5/0658; H01S 5/06804
See application file for complete search history.

(56) References Cited

FOREIGN PATENT DOCUMENTS

JP    2009-026996 A   2/2009

*Primary Examiner* — Armando Rodriguez
(74) *Attorney, Agent, or Firm* — Venable LLP; Michael A. Sartori; Laura G. Remus

(57) ABSTRACT

A method for controlling a wavelength tunable laser is disclosed, wherein a temperature of an optical waveguide is used in the wavelength tunable laser as a driving condition. The method comprises: acquiring a first driving condition from a memory, the wavelength tunable laser being operable to emit light of a first wavelength in the first driving condition; calculating a second driving condition using the first driving condition and a wavelength difference between the first wavelength and a second wavelength different from the first wavelength, the wavelength tunable laser being operable to emit light of the second wavelength in the second driving condition, the second driving condition being calculated under a condition that a temperature of the optical waveguide is always lower than a temperature of the optical waveguide represented by the first driving condition; and driving the wavelength tunable laser based on the second driving condition.

10 Claims, 10 Drawing Sheets

Fig.3

| Ch | DEFAULT VALUES | | | | | | | FEEDBACK-CONTROL TARGET VALUES | | | TEMPERATURE CORRECTION COEFFICIENT |
|---|---|---|---|---|---|---|---|---|---|---|---|
| | $I_{LD}$ [mA] | $I_{SOA}$ [mA] | $T_{LD}$ [degC] | $T_{Etalon}$ [degC] | $P_{Heater1}$ [mW] | $P_{Heater2}$ [mW] | $P_{Heater3}$ [mW] | $I_{m1}$ [μA] | $I_{m2}/I_{m1}$ A.U. | | $C1$ [GHz/°C] |
| 1 | 150.00 | 67.39 | 52.508 | 50.000 | 29.42 | 57.47 | 50.69 | 315.0 | 1.175 | | −1.87 |
| 2 | 150.00 | 47.74 | 34.533 | 50.000 | 64.38 | 81.31 | 72.45 | 317.5 | 1.518 | | |
| 3 | 150.00 | 50.86 | 38.727 | 50.000 | 59.05 | 77.71 | 69.12 | 313.0 | 1.229 | | |
| ... | ... | ... | ... | ... | ... | ... | ... | ... | ... | | |
| n | 150.00 | 54.77 | 54.046 | 50.000 | 41.24 | 43.32 | 11.69 | 317.2 | 1.441 | | |

METHOD FOR CONTROLLING WAVELENGTH TUNABLE LASER

BACKGROUND OF THE INVENTION

1. Field of the Invention

The present invention relates to a method for controlling a wavelength tunable laser.

2. Related Background Art

Japanese Patent Application Publication No. 2009-026996 discloses a wavelength tunable laser capable of selecting an wavelength of output light.

SUMMARY OF THE INVENTION

Japanese Patent Application Publication No. 2009-026996 discloses the following technology: a driving condition for obtaining predetermined grid wavelengths is stored in the memory; and lasing operation at any of the grid wavelengths is controlled based on the stored driving condition. In a wavelength tunable laser in which the lasing wavelength can be changed periodically within a certain temperature range, controlling the lasing wavelength outside the temperature range is likely to affect the optical outputs.

It is an object of one aspect of the present invention to provide a method for controlling a wavelength tunable laser capable of preventing a deterioration in optical output.

A method for controlling a wavelength tunable laser having a temperature controller to control a waveguide therein according to one aspect of the present invention comprises: a first step of acquiring a first driving condition from a memory including an information of the temperature controller, the first driving condition relating to a condition to drive the laser in a first wavelength; a second step of calculating a second driving condition using the first driving condition and a wavelength difference between the first wavelength and a second wavelength different from the first wavelength, the calculation being executed in a condition that the temperature of the temperature controller is equal to or lower than the temperature of the temperature controller in the first driving condition; and a third step of driving the wavelength tunable laser based on the second driving condition in the second step.

The memory stores a driving condition for obtaining predetermined grid wavelengths in the technology that is disclosed in Japanese Patent Application Publication No. 2009-026996, and the stored driving condition is used to control lasing operation at any of the grid wavelengths. In a wavelength tunable laser in which a lasing wavelength can be changed periodically within a certain temperature range, controlling the lasing wavelength outside the temperature range is likely to increase the amount of power consumed in temperature control.

It is another object of another aspect of the present invention to provide a method for controlling a wavelength tunable laser capable of reducing power consumption.

A method for controlling a wavelength tunable laser having a temperature controller to control a waveguide therein according to another aspect of the present invention comprises: a first step of acquiring a first driving condition from a memory including an information of the temperature controller, the first driving condition relating to a condition to drive the laser in a first wavelength; a second step of calculating a second driving condition using the first driving condition and a wavelength difference between the first wavelength and a second wavelength different from the first wavelength, the calculation being executed in a condition that the temperature of the temperature controller is equal to or higher than the temperature of the temperature controller in the first driving condition; and a third step of driving the wavelength tunable laser based on the second driving condition in the second step.

BRIEF DESCRIPTION OF THE DRAWINGS

The foregoing and other objects, features and advantages of the present invention will become understood more readily from the preferred embodiments of the present invention described hereinafter in detail with reference to the accompanying drawings.

FIG. 3 is a diagram showing the table of initial values and feedback control target values.

DESCRIPTION OF EMBODIMENTS

Figure 1:
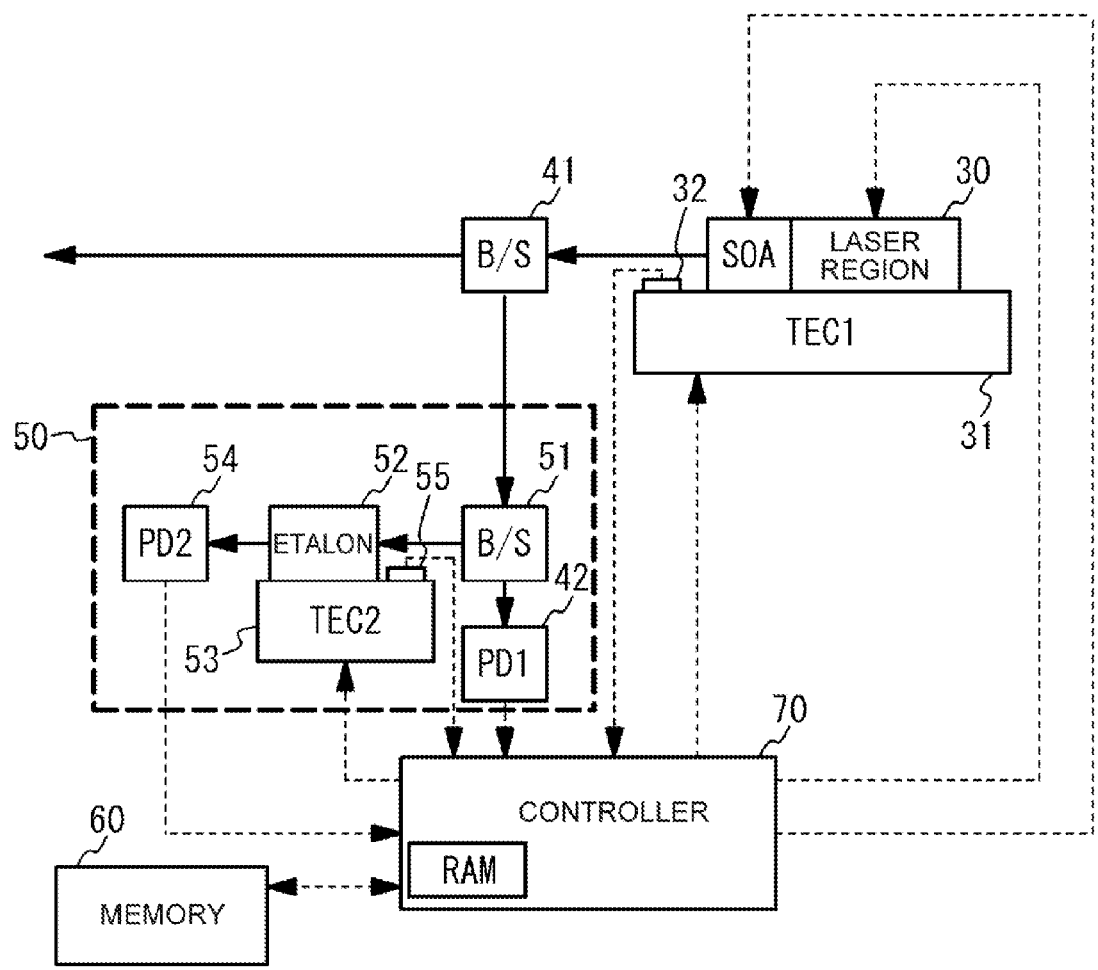
FIG. 1 is a block diagram showing the entire configuration of a wavelength tunable laser according to Embodiment 1.

Specific examples of the present invention will now described below.

A method for controlling a wavelength tunable laser having a temperature controller to control a waveguide therein according to one embodiment of the present invention comprises: a first step of acquiring a first driving condition from a memory including an information of the temperature controller, the first driving condition relating to a condition to drive the laser in a first wavelength; a second step of calculating a second driving condition using the first driving condition and a wavelength difference between the first wavelength and a second wavelength different from the first wavelength, the calculation being executed in a condition that the temperature of the temperature controller is equal to or lower than the temperature of the temperature controller in the first driving condition; a third step of driving the wavelength tunable laser based on the second driving condition in the second step. In the method, the first step includes a step of selecting the first wavelength in a condition that the second wavelength is achieved by controlling the temperature of the temperature controller equal to or lower than the temperature of the temperature controller in the first driving condition. In the method, a temperature of the wavelength tunable laser is controlled by a temperature control device including a Peltier element. In the method, the wavelength tunable laser includes an array laser having plural DFB lasers. In the method, the wavelength tunable laser includes a SG-DFB.

A method for controlling a wavelength tunable laser having a temperature controller to control a waveguide therein according to another embodiment of the invention of the present application comprises: a first step of acquiring a first driving condition from a memory including an information of the temperature controller, the first driving condition relating to a condition to drive the laser in a first wavelength; a second step of calculating a second driving condition using the first driving condition and a wavelength difference between the first wavelength and a second wavelength different from the first wavelength, the calculation being executed in a condition that the temperature of the temperature controller is equal to or higher than the temperature of the temperature controller in the first driving condition; and a third step of driving the wavelength tunable laser based on the second driving condition in the second step. In the method, the first step includes a step of selecting the first wavelength in a condition that the second wavelength is achieved by controlling the temperature of the temperature controller equal to or higher than the temperature of the temperature controller in the first driving condition. In the method, a temperature of the wavelength tunable laser is controlled by a temperature control device including a Peltier element. In the method, the wavelength tunable laser includes an array laser having plural DFB lasers. In the method, the wavelength tunable laser includes a SG-DFB.

A method for controlling a wavelength tunable laser using a temperature of an optical waveguide as a driving condition according to one embodiment of the invention of the present application comprises: a first step of acquiring a first driving condition from a memory, the wavelength tunable laser being operable to emit light of a first wavelength in the first driving condition; a second step of calculating a second driving condition using the first driving condition and a wavelength difference between the first wavelength and a second wavelength different from the first wavelength, the wavelength tunable laser being operable to emit light of the second wavelength of the second driving condition, the second driving condition is calculated in the second step under a condition that a temperature of the optical waveguide is always lower than a temperature, represented by the first driving condition, of the optical waveguide; and a third step of driving the wavelength tunable laser based on the second driving condition acquired in the second step. The wavelength tunable laser according to this configuration can prevent deterioration in optical output.

A method for controlling a wavelength tunable laser using a temperature of an optical waveguide as a driving condition according to another embodiment of the invention of the present application comprises: a first step of acquiring a first driving condition from a memory, the wavelength tunable laser being operable to emit light of a first wavelength in the first driving condition; a second step of calculating a second driving condition using the first driving condition and a wavelength difference between the first wavelength and a second wavelength different from the first wavelength, the wavelength tunable laser being operable to emit light of the second wavelength in second driving condition, the second driving condition being calculated in the second step under a condition that a temperature of the optical waveguide is always higher than a temperature, represented by the first driving condition, of the optical waveguide; and a third step of driving the wavelength tunable laser based on the second driving condition acquired in the second step. The wavelength tunable laser according to this configuration can reduce power consumption.

The temperature of the wavelength tunable laser may be controlled by a temperature control apparatus having a Peltier element. The wavelength tunable laser may comprise an array laser and the array laser includes plural DFB lasers. The wavelength tunable laser may include a SG-DFB.

Specific examples of the method for controlling a wavelength tunable laser according to the embodiments of the present invention are described hereinafter with reference to the drawings. It should be noted that the present invention is not limited to these embodiments and is intended by the appended claims to cover all such meanings equivalent to the claims and changes made within the scope thereof.

FIG. 1 is a block diagram showing the entire configuration of a wavelength tunable laser 100 according to Embodiment 1. As shown in FIG. 1, the wavelength tunable laser 100 includes a semiconductor laser 30 (tunable semiconductor laser) as a laser device that is capable of controlling the wavelength thereof. The semiconductor laser 30 of the present embodiment is provided with a region that is coupled to a laser region and forms a semiconductor optical amplifier (SOA). This SOA functions as an optical output controller. The SOA can increase or reduce the intensity of an optical output to any levels. The SOA can also control the intensity of an optical output to practically zero. The wavelength tunable laser 100 also has a detector 50, a memory 60, a controller 70 and the like. The detector 50 functions as an output detector and a wavelength locker. The controller 70 controls the wavelength tunable laser 100 and includes a random access memory (RAM).

Figure 2:
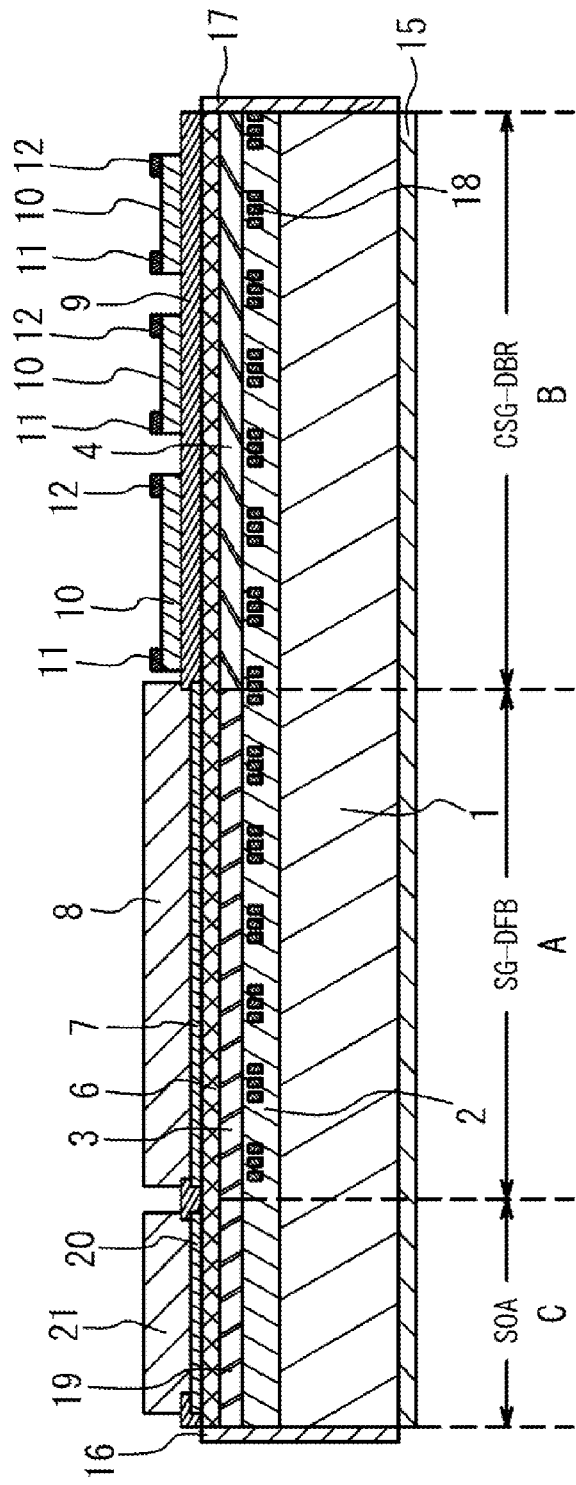
FIG. 2 is a schematic cross-sectional view showing the entire configuration of a semiconductor laser according to the embodiment.

FIG. 2 is a schematic cross-sectional view showing the entire configuration of the semiconductor laser 30 according to the present embodiment. As shown in FIG. 2, the semiconductor laser 30 has a sampled grating distributed feedback (referred to as "SG-DFB") region A, a chirped sampled grating distributed Bragg reflector (referred to as "CSG-DBR") region B, and a semiconductor optical amplifier (SOA) region C. In other words, the semiconductor laser 30 has a wavelength-selecting mirror in its semiconductor structure.

For example, the SOA region C, the SG-DFB region A, and the CSG-DBR region B are arranged in this order in the direction from the front side of the semiconductor laser 30 to the rear side. The SG-DFB region A has a sampled grating with an optical gain. The CSG-DBR region B has a sampled grating without an optical gain. The SG-DFB region A and the CSG-DBR region B correspond to the laser region shown in FIG. 1, and the SOA region C corresponds to the SOA region shown in FIG. 2.

The SG-DFB region A has a structure which includes a lower cladding layer 2, an active layer 3, an upper cladding layer 6, a contact layer 7, and an electrode 8 which are stacked on a substrate 1. The CSG-DBR region B has a structure which includes the lower cladding layer 2, an optical waveguide layer 4, the upper cladding layer 6, an insulating film 9, and a plurality of heaters 10, which are stacked on the substrate 1. Each of the heaters 10 is provided with a power supply electrode 11 and a ground electrode 12. The SOA region C has a structure which includes the lower cladding layer 2, an optical amplification layer 19, the upper cladding layer 6, a contact layer 20, and an electrode 21, which are stacked on the substrate 1.

The substrate 1, the lower cladding layer 2, and the upper clear layer 6 are formed integrally across the SG-DFB region A, the CSG-DBR region B, and the SOA region C. The active layer 3, the optical waveguide layer 4, and the optical amplification layer 19 are arranged in plane with an plane. The boundary between the SG-DFB region A and the CSG-DBR region B is located at the boundary between the active layer 3 and the optical waveguide layer 4.

An end film 16 is formed on the end faces of the substrate 1, the lower cladding layer 2, the optical amplification layer 19, and the upper cladding layer 6, which are in the SOC region C. In the present embodiment, the end film 16 can constitute an antireflection (AR) film. The end film 16 provides a front-side end face of the semiconductor laser 30. An end film 17 is formed on the end faces of the substrate 1, the lower cladding layer 2, the optical waveguide layer 4, and the upper cladding layer 6, which are in the CSG-DBR region B. In the present embodiment, the end film 17 can be an AR film. The end film 17 provides a rear-side end face of the semiconductor laser 30.

The substrate 1 is, for example, a crystal substrate made of n-type InP. The lower cladding layer 2 and the upper cladding layer 6 are made of, for example, n-type InP and p-type InP, respectively. The lower cladding layer 2 and the upper cladding layer 6 sandwich the active layer 3, the optical waveguide layer 4, and the optical amplification layer 19 to confine light into these layers.

The active layer 3 is made of a semiconductor capable of optical gain. The active layer 3 has, for example, a quantum well structure including one or more well layers made of, for example, $Ga_{0.32}In_{0.68}As_{0.92}P_{0.08}$ (5 nm in thickness) and barrier layers made of $Ga_{0.22}In_{0.78}As_{0.47}P_{0.53}$ (10 nm thickness), which are alternately stacked. The optical waveguide layer 4 can be made of, for example, a bulk semiconductor layer, such as $Ga_{0.22}In_{0.78}As_{0.47}P_{0.53}$. In the present embodiment, the optical waveguide layer 4 has an energy gap greater than that of the active layer 3.

The optical amplification layer 19 is in a region that generates an optical gain in response to injection of current from the electrode 21, and accomplishes optical amplification thereby. The optical amplification layer 19 may have, for example, a quantum well structure in which one or more well layers made of, for example, $Ga_{0.35}In_{0.65}As_{0.99}P_{0.01}$ (5 nm in thickness) and barrier layers made of $Ga_{0.15}In_{0.85}As_{0.32}P_{0.68}$ (10 nm thickness) are alternately stacked. A bulk semiconductor made of, for example, $Ga_{0.44}In_{0.56}As_{0.95}P_{0.05}$ can be employed as another structure for optical amplification layer 19. Note that the optical amplification layer 19 can be made of the same material as the active layer 3.

The contact layers 7, 20 can be made of, for example, p-type $Ga_{0.47}In_{0.53}As$ crystal. The insulating film 9 works as a protective film made of a silicon nitride film (SiN) or silicon oxide film (SiO). The heaters 10 each includes a thin-film resistor made of, for example, titanium tungsten (TiW). The heaters 10 may be formed across boundaries between segments, adjacent to each other, in the CSG-DBR region B.

The electrodes 8, 21, the power supply electrode 11, and the ground electrode 12 are made of a material with electrical conductivity, such as gold (Au). A back electrode 15 is formed on the backside of the substrate 1. The back electrode 15 is formed across the SG-DFB region A, the CSG-DBR region B and the SOA region C.

The end film 16 and the end film 17 are each an AR film having a reflectivity of 1.0% or less, which makes the end faces thereof substantially non-reflective. These AR films can each be a dielectric film made of, for example, $MgF_2$ and TiON. The end facets of the laser are configured by the AR films in the present embodiment, and in some cases the end film 17 is configured by a reflective film of a significant reflectivity. In the device structure where the semiconductor in contact with the end film 17 shown in FIG. 2 includes a light absorbing layer, the application of significant reflectivity to the end film 17 prevents light from leaking from the end film 17 to the outside. Significant reflectivity means a reflectivity of, for example, 10% or higher. The reflectivity here means reflectivity to the inside of the semiconductor laser.

Plural diffraction gratings (corrugations) 18 are formed in the lower cladding layer 2 of the SG-DFB region A and the CSG-DBR region B and arranged at predetermined intervals. Therefore, a sampled grating is formed in the SG-DFB region A and the CSG-DBR region B. A plurality of segments is provided in the lower cladding layer 2 in the SG-DFB region A and the CSG-DBR region B. Each of the segments is a region having a single grating portion with a diffraction grating 18 and a single spacing portion without a diffraction grating 18 which are connected to each other. In other words, the plurality of segments is arranged to form a region in which the spacing portions and the grating portions are alternately arranged such that the single spacing portion in each segment is between the grating portions. The diffraction gratings 18 are made of a material that has a refractive index different from the material of the lower cladding layer 2. When the lower cladding layer 2 is made of InP, the diffraction gratings 18 can be made of, for example, $Ga_{0.22}In_{0.78}As_{0.47}P_{0.53}$.

Patterning for the diffraction gratings 18 can be carried out in a patterning step with use of a two-beam interference exposure method. The grating portions and the spacing portions, each of which is between the diffraction gratings 18, can be formed by two step exposure, e.g., applying a pattern for the diffraction gratings 18 to a resist by the first exposure and then by applying a pattern for area corresponding to the spacing portion to the thus exposed resist by the second exposure. The pitch of the diffraction gratings 18 in the SG-DFB region A may be the same as or different from the pitch of the diffraction gratings 18 in the CSG-DBR region B. In the present embodiment, these pitches are set at the same value. In addition, the length of the diffraction gratings 18 may be the same or different in each of the segments. The diffraction gratings 18 of the SG-DFB region A and the CSG-DBR region B may all have the same length or may have different lengths.

The segments in the SG-DFB region A have substantially the same optical length. In the CSG-DBR region B, on the other hand, at least two segments have different optical lengths. Accordingly, the peak intensities in the wavelength characteristics of the CSG-DBR region B depend upon wavelength. The average optical length of the segments in the SG-DFB region A is different from that of the segments in the CSG-DBR region B. The segments of the SG-DFB region A and the segments of the CSG-DBR region B configure an optical cavity for the semiconductor laser 30.

Light beams reflected in the SG-DFB region A and the CSG-DBR region B interfere with each other. When carriers are injected into the active layer 3 of the SG-DFB region A, the SG-DFB region A generates a discrete gain spectrum in which the peaks, having a substantially equivalent intensity, are arranged at a predetermined wavelength interval. The CSG-DBR region B, on the other hand, generates another discrete reflection spectrum in which the peaks, having substantially different intensities, are arranged at another predetermined wavelength interval. The interval of the peak wavelengths of the wavelength characteristics in the SG-DFB region A is different from that in CSG-DBR region B. A vernier effect caused by a combination of the two wavelength characteristics provides a wavelength that satisfies the lasing condition.

As shown in FIG. 1, the semiconductor laser 30 is disposed on a first temperature control device 31. The first temperature control device 31 includes a Peltier element and functions as a TEC (Thermoelectric Cooler). A first thermister 32 is disposed on the first temperature control device 31. The first thermister 32 detects the temperature of the first temperature control device 31. The temperature of the semiconductor laser 30 can be specified based on the temperature detected by the first thermister 32.

In the wavelength tunable laser 100, the detector 50 is disposed on the front side of the semiconductor laser 30. Because the detector 50 functions as a wavelength locker, the wavelength tunable laser 100 can be of a front locking type. The detector 50 has a first light receiving device 42, a beam splitter 51, an etalon 52, a second temperature control apparatus 53, a second light receiving device 54, and a second thermister 55.

A beam splitter 41 is located at a position where an optical beam output from the front side of the semiconductor laser 30 branches off. The beam splitter 51 is located at a position where the optical beams from the beam splitter 41 can be split thereby, and the first light receiving device 42 is provided to receive one of the two optical beams created by the beam splitter 51. The etalon 52 is disposed at a position where the other of the two optical beams created by the beam splitter 51 is transmitted therethrough. The second light receiving device 54 is provided to receive the optical beam transmitted through the etalon 52.

The etalon 52 has an optical spectrum characterized in a periodic change in transmittance dependent upon the wavelength of incident light. In the present embodiment, solid etalon is used as the etalon 52. The periodical wavelength characteristics of the solid etalon change depending upon temperature change. The etalon 52 is disposed at a position where the other of the two optical beams created by the beam splitter 51 is transmitted therethrough. The etalon 52 is disposed on the second temperature control device 53. The second temperature control device 53 includes a Peltier element and functions as a thermoelectric cooler (TEC).

The second light receiving device 54 is provided to receive the light transmitted through the etalon 52. The second thermister 55 is used in order to specify the temperature of the etalon 52. The second thermister 55 is disposed on, for example, the second temperature control device 53. In the present embodiment, the temperature of the second temperature control device 53 is detected by the second thermister 55, thereby specifying the temperature of the etalon 52.

The memory 60 may be a rewritable storage device. Examples of the rewritable storage device may include a typical flash memory. The controller 70 has a central processing unit (CPU), a random access memory (RAM), a power supply, and the like. The RAM may be a memory for temporarily storing a program executed by the CPU, data processed by the CPU, and the like.

The memory 60 stores the default values for the components of the wavelength tunable laser 100 and feedback control target values in association with channels. Each channel is represented by the number corresponding to the lasing wavelengths of the semiconductor laser 30. For example, the channels correspond to grid wavelengths in accordance with an International Telecommunication Union Telecommunication Standardization Sector (ITU-T). In the present embodiment, the wavelength of each of the channels is defined as the fundamental wavelength.

FIG. 3 is a diagram showing a table containing the default values and the feedback control target values. In the following description, the default values and the feedback-control target values are also referred to as driving conditions. As shown in FIG. 3, each of the default values includes an initial current value $I_{LD}$ supplied to the electrode 8 of the SG-DFB region A, an initial current value $I_{SOA}$ supplied to the electrode 21 of the SOA region C, an initial temperature value $T_{LD}$ of the semiconductor laser 30, an initial temperature value $T_{Etalon}$ of the etalon 52, and initial power values $P_{Heater1}$ to $P_{Heater3}$ supplied to the heaters 10. These initial values are defined for each channel. The feedback-control target values are used as target values for the execution of feedback control that the controller 70 carries out. Each of feedback-control target values include a target value $I_{m1}$ of a photoelectric current provided by the first light receiving element 42, and a target value ratio $I_{m2}/I_{m1}$ between the photoelectric current $I_{m1}$ provided by the first light receiving element 42 and a photoelectric current $I_{m2}$ provided by the second light receiving element 54. The control target value also is defined for each channel. In addition, a temperature correction coefficient C1 is stored in the memory 60. The temperature correction coefficient C1 is described hereinafter in detail. In the present embodiment, the temperature correction coefficient C1 is common to all the channels. It should be noted that, prior to shipment of the wavelength tunable lasers 100, these values are obtained for each individual device in the fabrication of the wavelength tunable laser 100 by the tuning thereof with a wavemeter.

Figure 4A:
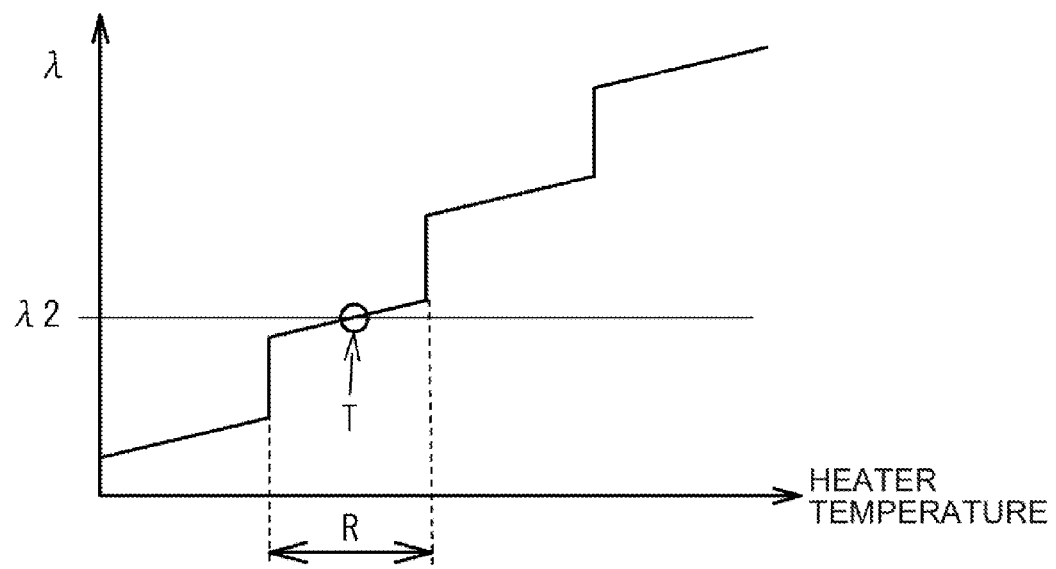
FIG. 4A is a diagram showing the relationship between the temperature of heaters and the lasing wavelengths of the semiconductor laser.

FIG. 4A is a diagram showing the relationship between temperatures of the heaters 10 and lasing wavelengths λ of the semiconductor laser 30. In FIG. 4A, the temperature of the semiconductor laser 30 is kept constant by the first temperature control device 31. The horizontal axis represents the average temperature of the heaters 10, and the vertical axis represents the lasing wavelength of the semiconductor laser 30. The semiconductor laser 30 emits a laser beam at a wavelength in which a gain peak in a gain spectrum of the SG-DFB region A and a reflection peak in a reflection spectrum of the CSG-DBR region B are matched with each other. Accordingly, possible lasing wavelengths for the semiconductor laser 30 are distributed at a predetermined wavelength interval to provide, in other words, discrete wavelength characteristics with the semiconductor laser 30.

In order to select a fundamental wavelength λ2, which is one of the fundamental wavelengths, the average temperature of the heaters 10 is set in a range R and the temperature of the first temperature control device 31 is set at a predetermined temperature, thereby selecting a part that is smooth with little wavelength changes in the characteristics in FIG. 4A (this part is referred to as "terrace part," hereinafter). The temperature of the first temperature control device 31 is controlled in the selected terrace part to select the fundamental wavelength λ2 at the center T of the terrace part.

Figure 4B:
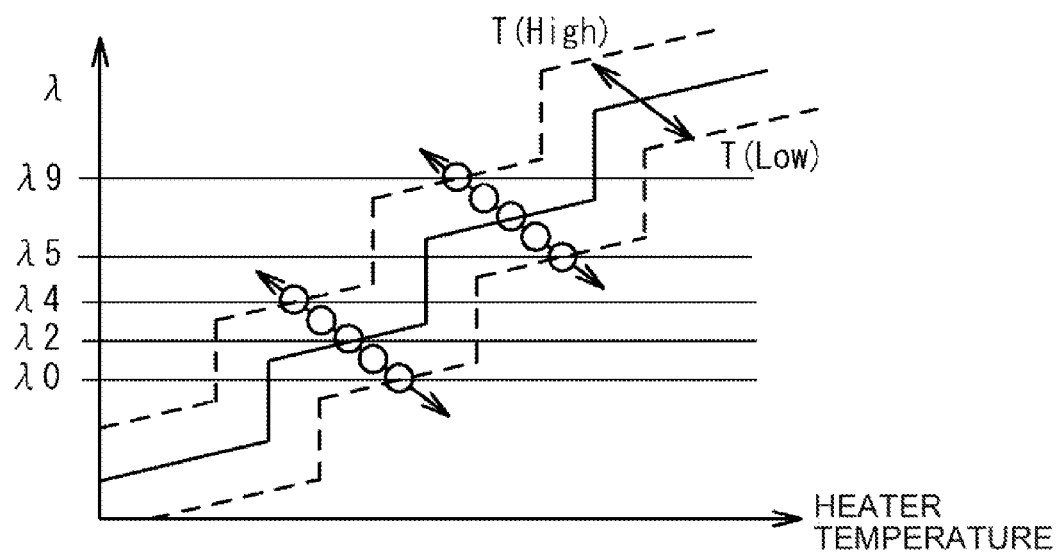
FIG. 4B is a diagram showing the relationship between the temperature of the heater and the lasing wavelengths of the semiconductor laser.

As shown in FIG. 4B, if the temperature of the first temperature control device 31 is changed within the range of T(Low) to T(High) (T(High)>T(Low)) in this state, an lasing wavelength can be selected from among fundamental wavelengths λ0 to λ4. When selecting a wavelength other than the fundamental wavelengths λ0 to λ4, the temperature of the heaters 10 may be increased or lowered, and then the temperature of the first temperature control device 31 may be changed within the range of T(Low) to T(High). In the example shown in FIG. 4B, the lasing wavelength can be selected from among fundamental wavelengths λ5 to λ9 by increasing the temperature of the heaters 10 and by changing the temperature of the first temperature control device 31 within the range of T(Low) to T(High).

As described above, in the wavelength tunable laser 100, plural driving conditions corresponding to the fundamental wavelengths of the semiconductor laser 30 are set in such a manner that the fundamental wavelengths are located at a predetermined wavelength interval, and the fundamental wavelengths are arranged periodically within a predetermined temperature range for the first temperature control device 31. Lasing at any fundamental wavelength can be realized by executing combination control of the temperatures of the heaters 10 and the temperature of the first temperature control device 31. Note that in the present embodiment, five fundamental wavelengths are set within the range of T (Low) to T (High) but that the number of fundamental wavelengths is not limited thereto.

Figure 5:
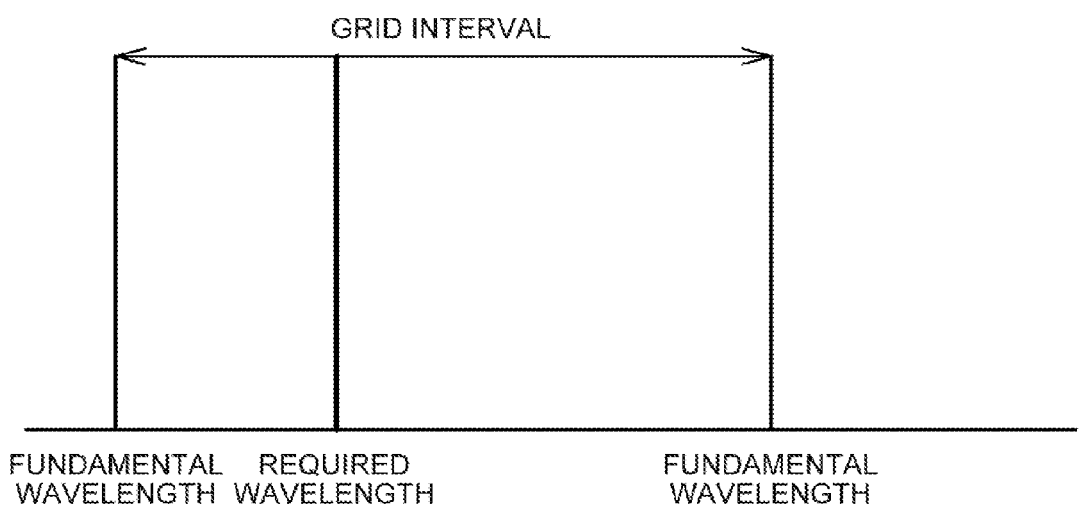
FIG. 5 is a diagram showing the relationship between a required wavelength and fundamental wavelengths for gridless control.

The wavelength tunable laser 100 according to the present embodiment can provide a required wavelength even when the required wavelength does not match any of the fundamental wavelengths. A control for enabling output of light having a wavelength different from the fundamental wavelengths is referred to as "gridless control," hereinafter. FIG. 5 is a diagram showing the relationship between the required wavelength and the fundamental wavelengths in the gridless control. In the gridless control, as shown in FIG. 5, the required wavelength is a wavelength between one fundamental wavelength and another fundamental wavelength adjacent thereto. Note that the required wavelength may be the same as one of the fundamental wavelengths to be located thereon.

Figure 6:
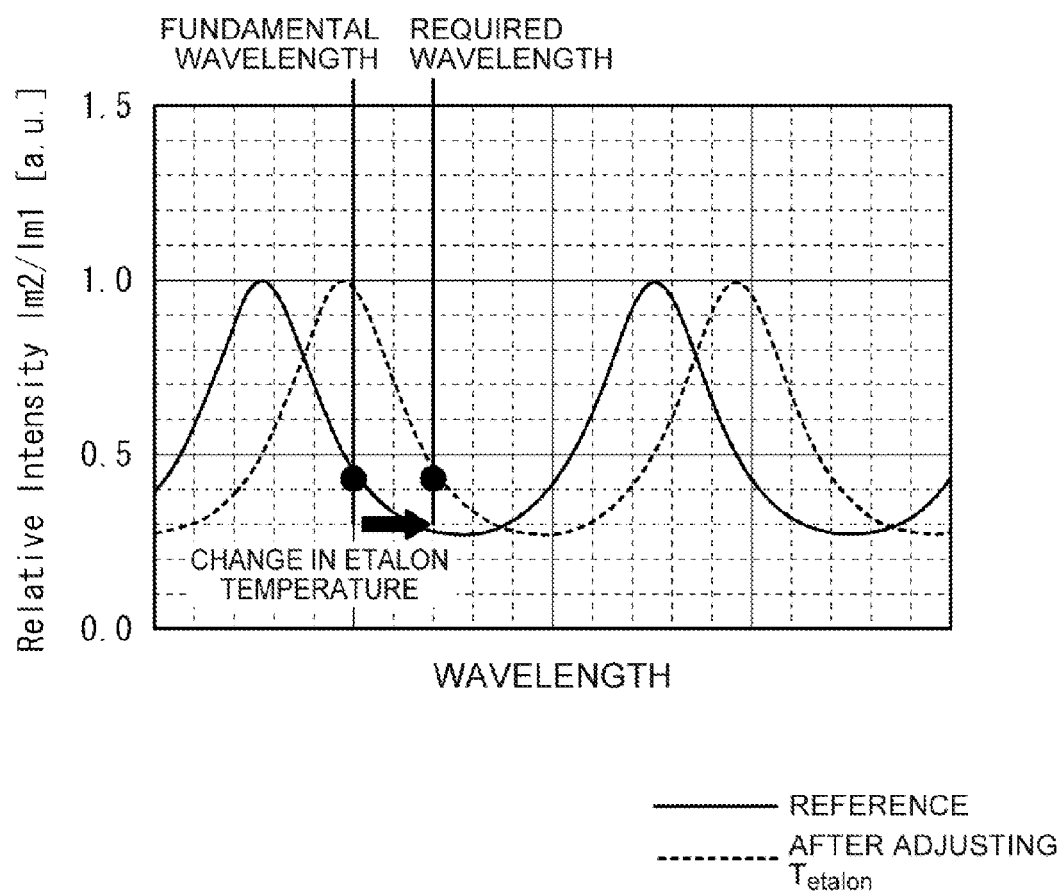
FIG. 6 is a diagram showing the principle of the gridless control.

FIG. 6 is a diagram showing the principle of the gridless control. In FIG. 6, the horizontal axis represents wavelength of light and the vertical axis represents the normalized value of the ratio $I_{m2}/I_{m1}$ (the transmittance of the etalon 52). The solid line shown in FIG. 6 represents the wavelength characteristics corresponding to the initial temperature value $T_{Etalon}$ of the etalon 52. The broken line represents the wavelength characteristics of the etalon 52 the temperature of which is raised by the second temperature control device 53. In the case where the ratio $I_{m2}/I_{m1}$ shown by the black circle on the solid line is employed as a feedback-control target value, when the etalon 52 has the initial temperature value $T_{Etalon}$, lasing of the semiconductor laser 30 occurs at a fundamental wavelength. However, when the etalon 52 has the temperature corresponding to the wavelength characteristics shown by the broken line, the actual lasing wavelength is at a position shifted from the fundamental wavelength by the difference in the etalon characteristics even even when the ratio $I_{m2}/I_{m1}$ represents the value for acquiring the fundamental wavelength (the black circle on the broken line). In other words, the etalon characteristics is shifted by a value indicating the wavelength difference between the required wavelength and the fundamental wavelength, thereby causing lasing at the required wavelength while keeping the ratio $I_{m2}/I_{m1}$ for the feedback-control target value. Specifically, computation for changing the etalon temperature can be carried out based on the wavelength difference ΔF between the required wavelength and the fundamental wavelength, and the computation result can be adopted as the etalon temperature, thereby realizing the required wavelength. Note that, in the present embodiment, the FSR (free spectral range) of the etalon 52 is configured at intervals of, for example, 50 GHz or the like.

As described above, the wavelength characteristics of the etalon 52 shift according to the temperature of the etalon 52. The frequency variation/temperature variation [GHz/° C.] of the etalon 52 is called "temperature correction coefficient C1 of the etalon 52." Note that the wavelengths here are expressed in terms of frequencies. The temperature correction coefficient C1 corresponds to a change rate in the driving condition for driving the wavelength tunable laser to wavelength change.

Assume that the setting temperature of the etalon 52 for controlling the required wavelength is Tetln_A[° C.]. Also, assume that the initial temperature of the etalon 52, i.e., the temperature of the etalon 52 corresponding to a selected fundamental wavelength, is Tetln_B[° C.]. Tetln_B corresponds to $T_{Etalon}$ and is acquired from the memory 60.

Assume that the wavelength difference (absolute value) between the fundamental wavelength and the required wavelength is expressed as ΔF [GHz]. In this case, the relation between the parameters can be expressed by Formula (1). The setting temperature Tetln_A required for obtaining the required wavelength can be derived using the following Formula (I):

$$\text{Tetln}\_A = \text{Tetln}\_B + \Delta F/C1 \qquad (1).$$

By controlling the temperature of the second temperature control device 53 to the setting temperature Tetln_A, the required wavelength can be obtained using the ratio $I_{m2}/I_{m1}$ directly, i.e., without change.

Through the execution of the operations described above, as shown in FIG. 6, lasing of the semiconductor laser 30 can be caused at the wavelength (required wavelength) that is shifted from the fundamental wavelength by the change in the characteristics of the etalon 52. As described above, although the ratio $I_{m2}/I_{m1}$ can be use as it is, control on the temperature of the first temperature control device 31 and the temperature of the heaters 10 causes continuous change in the lasing wavelength of the semiconductor laser 30.

In order to execute the foregoing gridless control, as described with reference to FIG. 4B, the combination control in which the control of the temperature of the heaters 10 and the control of the temperature of the first temperature control device 31 are combined with each other may be carried out. For example, not only a fundamental wavelength but also any wavelength can be selected within the range of the fundamental wavelengths λ0 to λ4 by controlling the average temperature of the heaters 10 to a predetermined temperature and controlling the temperature of the first temperature control device 31 within the range of T (Low) to T (High). Moreover, any lasing wavelength can be selected within the range of the fundamental wavelengths λ5 to λ9 by making the average temperature of the heaters 10 higher than that in which the fundamental wavelengths λ0 to λ4 are realized.

(Preventing Deterioration in Optical Output)

Changing the lasing wavelength between the fundamental wavelength λ4 and the fundamental wavelength λ5 is now considered. In other words, controlling the wavelength outside the temperature range associated with the first temperature control device 31 for realizing the periodicity of the fundamental wavelengths is considered. This takes into consideration the following controls: the control in which the temperature of the first temperature control device 31 is raised to a temperature higher than T (High) from the driving condition for the fundamental wavelength λ4; and the control in which the temperature of the first temperature control device 31 is lowered to a temperature lower than T (Low) from the driving condition for the fundamental wavelength λ5. The temperature of the semiconductor laser 30 increases as the temperature of the first temperature control device 31 increases.

Figure 7:
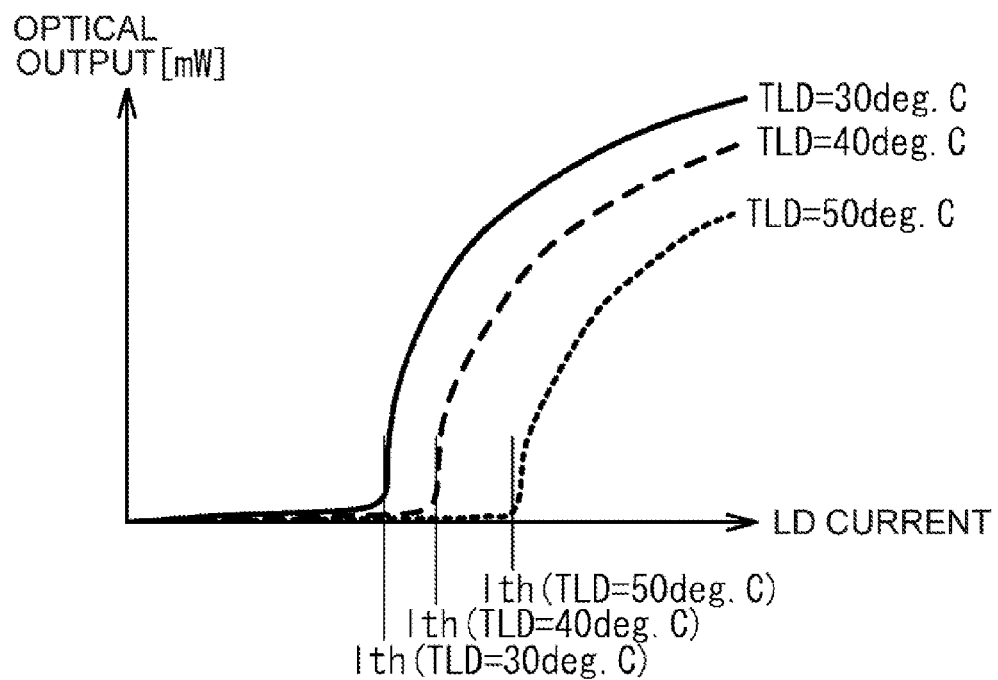
FIG. 7 is a diagram showing the relationship among the temperature of the semiconductor laser, current supplied to a SG-DFB region A, and optical output of the semiconductor laser.

FIG. 7 is a diagram showing the relationship among the temperature (TLD) of the semiconductor laser 30, current (LD current) supplied to the electrode 8 of the SG-DFB region A, and optical output of the semiconductor laser 30. As shown in FIG. 7, when the temperature of the semiconductor laser 30 increases, the optical output thereof is reduced as the threshold value current increases. In other words, increase in the temperature of the semiconductor laser 30 deteriorates the optical output thereof.

According to the present embodiment, therefore, in the case where the wavelength is controlled outside the range of the temperature of the first temperature control device 31 for realizing the fundamental wavelengths arranged periodically, the temperature of the first temperature control device 31 is controlled in one direction from a high temperature to a low temperature in order to set the lasing wavelength at any wavelength from a fundamental wavelength. Specifically, when the lasing wavelength is changed to a value between the fundamental wavelength λ4 and the fundamental wavelength λ5 in order to set the lasing wavelength at any wavelength between the fundamental wavelength λ4 (first fundamental wavelength) and the adjacent fundamental wavelength λ5 (second fundamental wavelength), the lasing wavelength is continuously changed from the fundamental wavelength where the first temperature control device 31 has a higher temperature. That is, the following control is carried out: between the fundamental wavelength λ4 (first fundamental wavelength) and the adjacent fundamental wavelength λ5 (second fundamental wavelength), the temperature of the first temperature control device 31 is lowered from a high temperature to a low temperature.

Figure 8:
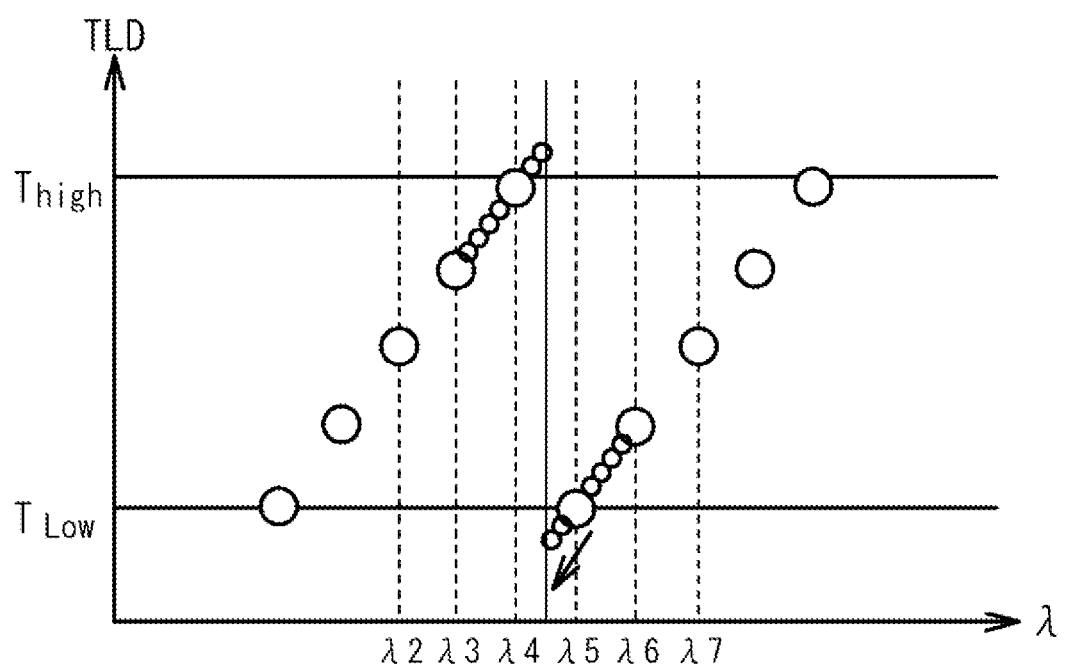
FIG. 8 is a diagram for explaining the effects of the embodiments.

The effects obtained in this case are now described. When controlling the lasing wavelength to a wavelength between the fundamental wavelength λ5 and the fundamental wavelength λ6 as shown in FIG. 8, the temperature of the first temperature control device 31 is reduced from the temperature at which the first temperature control device 31 realizes the fundamental wavelength λ6. Also when controlling the lasing wavelength to a wavelength between the fundamental wavelength λ4 and the fundamental wavelength λ5, the temperature of the first temperature control device 31 is reduced from the temperature (T(Low)) at which the first temperature control device 31 realizes the fundamental wavelength λ5. In this case, when the temperature of the first temperature control device 31 is controlled outside the range of T (Low) to T (High), the temperature of the first temperature control device 31 is controlled to a temperature lower than this range. This control can prevent optical output deterioration, which may be caused when controlling the temperature of the first temperature control device 31 outside the range of T(Low) to T(High), in the semiconductor laser 30, resulting in that high optical output can be realized in the semiconductor laser 30.

The present embodiment can achieve high optical output of the semiconductor laser 30 by lowering the temperature of the SG-DFB region of the semiconductor laser 30 because the gain of the SG-DFB region increases as a result of lowering the temperature of the SG-DFB region. The active layer of the SG-DFB region is made of a MQW active layer, and the use of a bulk waveguide active layer can similarly achieve a high optical output of the semiconductor laser 30 by lowering the temperature of the SG-DFB region. Even in a semiconductor laser in which a phase adjuster is provided in the SG-DFB region of the present embodiment, high optical output of the semiconductor laser can be achieved by lowering the temperature of the SG-DFB region. Even in the SOA, high optical output can also be achieved by similar lowering of the temperature. Even in a semiconductor laser in which the SOA region is disposed between CSG-DBR regions, the high optical output of the semiconductor laser can be realized by lowering the temperature of the SOA region.

Note that the present embodiment describes the situation where the temperature of the first temperature control device 31 is controlled outside the range of T (Low) to T (High); the present embodiment can, however, prevent a deterioration in optical output even when the temperature of the first temperature control device 31 is controlled within the range of T (Low) to T (High). Nonetheless, the effect of avoiding the deterioration in optical output is more significant when the temperature of the first temperature control device 31 is controlled outside the range of T (Low) to T (High).

Figure 9:
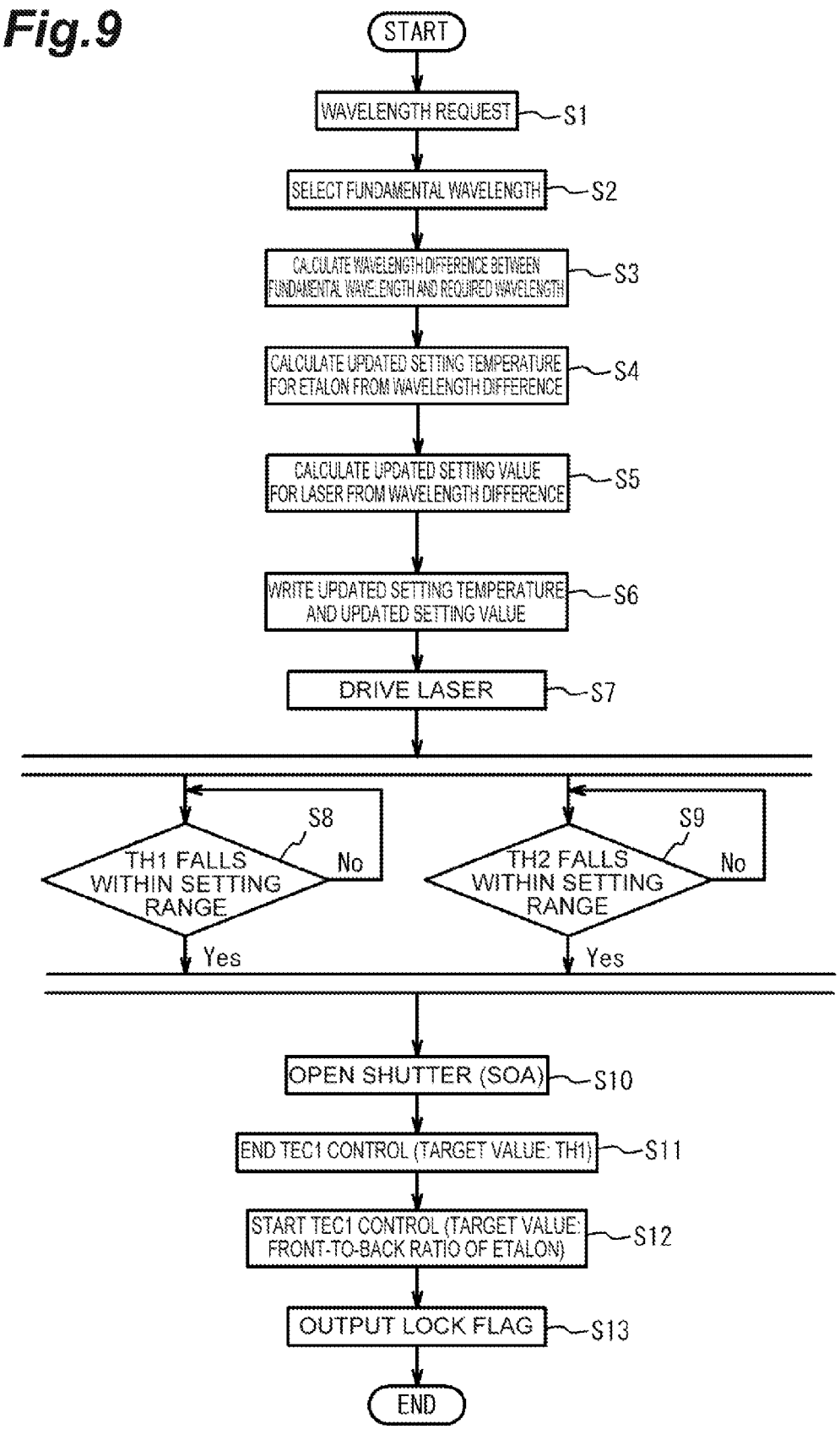
FIG. 9 is a flowchart for explaining the procedure of activating the wavelength tunable laser.

FIG. 9 is a flowchart for explaining the procedure of activating the wavelength tunable laser 100. As shown in FIG. 9, the controller 70 receives the required wavelength (step S1). This required wavelength is input through an external input/output device. Typically an input/output device with the RS232C standard interface is employed. The controller 70 then selects, as an example, one fundamental wavelength, at which the first temperature control device 31 has the higher temperature, out of the fundamental wavelengths between which the required wavelength is located (step S2). That is, a fundamental wavelength is selected and the following control is carried out: the temperature of the first temperature control device 31 is caused to decrease from a high temperature to a low temperature.

Next, the controller 70 calculates the wavelength difference ΔF between the fundamental wavelength and the required wavelength (step S3). The controller 70 then calculates an updated setting temperature of the etalon 52 (step S4). Subsequently, the controller 70 calculates an updated setting value of the semiconductor laser 30 (step S5). In this case, the updated setting value is calculated in such a manner that the temperature of the first temperature control device 31 is lowered from the fundamental wavelength at which the first temperature control device 31 has the higher temperature.

The controller 70 then stores, into the RAM therein, the updated setting temperature and the updated setting value calculated in steps S4 and S5 (step S6). The controller 70 then drives the semiconductor laser 30 using the updated setting temperature and the updated setting values stored in the RAM (step S7). Note that, at this step, the SOA region C is controlled so that the semiconductor laser 30 does not emit any light.

Next, the controller 70 executes automatic temperature control (ATC) such that a detected temperature TH1 of the first thermister 32 falls within the range of $T_{LD}$. Subsequently, the controller 70 determines whether a detected temperature TH1 of the first thermister 32 is within the range of $T_{LD}$ or not (step S8). The range of $T_{LD}$ means a predetermined range having a temperature value $T_{LD}$ of the updated setting value at the center thereof. When the determination in step S8 is "No," the controller 70 changes the current value supplied to the first temperature control device 31, in such a manner that the detected temperature TH1 of the first thermister 32 is made close to the temperature value $T_{LD}$.

In parallel to step S8, the controller 70 executes automatic temperature control (ATC) such that a detected temperature TH2 of the second thermister 55 falls within a setting range. The controller 70 determines whether a detected temperature TH2 of the second thermister 55 falls within a setting range or not (step S9). The setting range here is determined based on the setting temperature Tetln_A included in the updated setting values. For example, the setting range can be a predetermined range having the setting temperature Tetln_A at the center thereof. When the determination of step S9 is "No," the controller 70 changes the current value supplied to the second temperature control device 53, in such a manner that the detected temperature TH2 of the second thermister 55 becomes close to the setting temperature Tetln_A. Even when the determination of step S9 is "Yes," the ATC operation by the second temperature control device 53 is continued.

The controller 70 waits until the results of steps S8 and S9 are changed to "Yes." After the determinations of both steps S8 and S9 are changed to "Yes," the controller 70 executes a shutter open operation (step S10). Specifically, the controller 70 executes automatic power control (APC) of controlling the current supplied to the electrode 21 of the SOA region C to the initial current value $I_{SOA}$. As a result, the semiconductor laser 30 emits a laser beam of an updated wavelength therefrom. The automatic power control (APC) operation continues in step S10 as well.

Next, the controller 70 ends the temperature control, executed by the first temperature control device 31, in which the temperature value $T_{LD}$ is used as the control target value (step S11). The controller 70 then starts AFC control by means of the first temperature control device 31 (step S12). In other words, the controller 70 executes feedback control such that the temperature of the first temperature control device 31 satisfies the ratio $I_{m2}/I_{m1}$ of a feedback-control target value. The ratio between the optical power of the input light and the optical power of output light in the etalon 52 (front-to-back ratio) indicates the lasing wavelength of the semiconductor laser 30. Furthermore, the first temperature control device 31 provides a parameter for controlling the wavelengths of the semiconductor laser 30. In other words, in step S21, the AFC control for controlling the wavelength of the semiconductor laser 30 is carried out by executing feedback control of the temperature of the first temperature control device 31 such that the front-to-back ratio becomes $I_{m2}/I_{m1}$. Consequently, the required wavelength can be realized. When the controller 70 confirms that the ratio $I_{m2}/I_{m1}$ falls within the predetermined range having the target value $I_{m2}/I_{m1}$, associated with the fundamental wavelength selected in step S2, at the center thereof, the controller 70 outputs an lock flag (step S13). Subsequently, the flowchart ends.

According to the present embodiment, in order to control the lasing wavelength, the temperature of the first temperature control device 31 is controlled in one direction from a higher temperature to a lower temperature. In this control, the temperature of the first temperature control device 31 does not become higher than the range of T(Low) to T(High), thereby preventing the deterioration in optical output of the semiconductor laser 30.

(Reducing Power Consumption)

Changing the lasing wavelength between the fundamental wavelength λ4 and the fundamental wavelength λ5 is now considered. In other words, controlling the wavelength outside the temperature range associated with the first temperature control device 31 for realizing the periodicity of the fundamental wavelengths is considered. This takes into consideration the following controls: control in which the temperature of the first temperature control device 31 is increased to a temperature higher than T(High) from the driving condition for the fundamental wavelength λ4; and control in which the temperature of the first temperature control device 31 is reduced to a temperature lower than T(Low) from the driving condition for the fundamental wavelength λ5. Since the first temperature control device 31 performs the temperature control using the Peltier element, reducing the temperature leads to an increase in power consumption.

According to the present embodiment, therefore, in the case where the wavelength is controlled outside the temperature range of the first temperature control device 31 for realizing the periodicity of the fundamental wavelengths, the temperature of the first temperature control device 31 is controlled in one direction from a lower temperature to a higher temperature in order to set the lasing wavelength at any wavelength from a fundamental wavelengths. Specifically, in case of changing the lasing wavelength between the fundamental wavelength λ4 and the fundamental wavelength λ5, the lasing wavelength is continuously changed from the fundamental wavelength at which the temperature of the first temperature control device 31 has a lower temperature, thereby setting the lasing wavelength at any wavelength between the fundamental wavelength λ4 (first fundamental wavelength) and the adjacent fundamental wavelength λ5 (second fundamental wavelength). That is, the following control is carried out: between the fundamental wavelength λ4 (first fundamental wavelength) and the adjacent fundamental wavelength λ5 (second fundamental wavelength), the temperature of the first temperature control device 31 is raised from a low temperature to a high temperature.

The effects obtained in this case are now described. When controlling the lasing wavelength to a wavelength between the fundamental wavelength λ3 and the fundamental wavelength λ4 as shown in FIG. 7, the temperature of the first temperature control device 31 is increased from the temperature at which the first temperature control device 31 realizes the fundamental wavelength λ3. Also when controlling the lasing wavelength to a wavelength between the fundamental wavelength λ4 and the fundamental wavelength λ5, the temperature of the first temperature control device 31 is increased from the temperature (T(High)) at which the first temperature control device 31 realizes the fundamental wavelength λ4. In this case, when the temperature of the first temperature control device 31 is controlled outside the range of T(Low) to T(High), the temperature of the first temperature control device 31 is controlled to a temperature higher than this range. This results in that the amount of consumed power is reduced when controlling the temperature of the first temperature control device 31 outside the range of T(Low) to T(High).

Note that the present embodiment describes the case where the temperature of the first temperature control device 31 is controlled outside the range of T(Low) to T(High); however, the present embodiment can reduce power consumption even when the temperature of the first temperature control device 31 is controlled within the range of T(Low) to T(High). Nonetheless, the effect of reducing power consumption is more significant when the temperature of the first temperature control device 31 is controlled outside the range of T(Low) to T(High).

FIG. 9 is a flowchart for explaining the procedure of activating the wavelength tunable laser 100. As shown in FIG. 9, the controller 70 receives the required wavelength (step S1). This required wavelength is input through an external input/output device. Typically an input/output device with the RS232C standard interface is employed. The controller 70 then selects, as an example, one fundamental wavelength, at which the first temperature control device 31 has a lower temperature, out of the fundamental wavelengths between which the required wavelength is located (step S2). That is, a fundamental wavelength is selected and the following control is carried out: the temperature of the first temperature control device 31 is caused to decrease from a low temperature to a high temperature.

Next, the controller 70 calculates a wavelength difference ΔF between the fundamental wavelength and the required wavelength (step S3). The controller 70 then calculates an updated setting temperature of the etalon 52 (step S4). Subsequently, the controller 70 calculates an updated setting value of the semiconductor laser 30 (step S5). In this case, the updated setting value is calculated in such a manner that the temperature of the first temperature control device 31 is increased from the fundamental wavelength at which the first temperature control device 31 has the lower temperature.

The controller 70 then stores, into the RAM thereof, the updated setting temperature and the updated setting value calculated in steps S4 and S5 (step S6). Step S6 and the subsequent processes have already been described with reference to the flowchart in FIG. 9.

According to the present embodiment, in order to control the lasing wavelength, the temperature of the first temperature control device 31 is controlled in one direction from a lower temperature to a higher temperature. The temperature of the first temperature control device 31 does not become lower than the range of T(Low) to T(High), resulting in a reduction in power consumption of the first temperature control device 31.

The processes for preventing a deterioration in optical output and reducing power consumption have been described.

Light sources to which the present embodiment can be applied are not limited to the semiconductor laser 30 shown in FIG. 2. Any light source can be employed as long as it is a semiconductor laser that can select an output wavelength by controlling the temperature of the wavelength selection section. Examples of such light sources include a DFB laser, a SG-DFB laser, and a DFB array laser.

Figure 10:
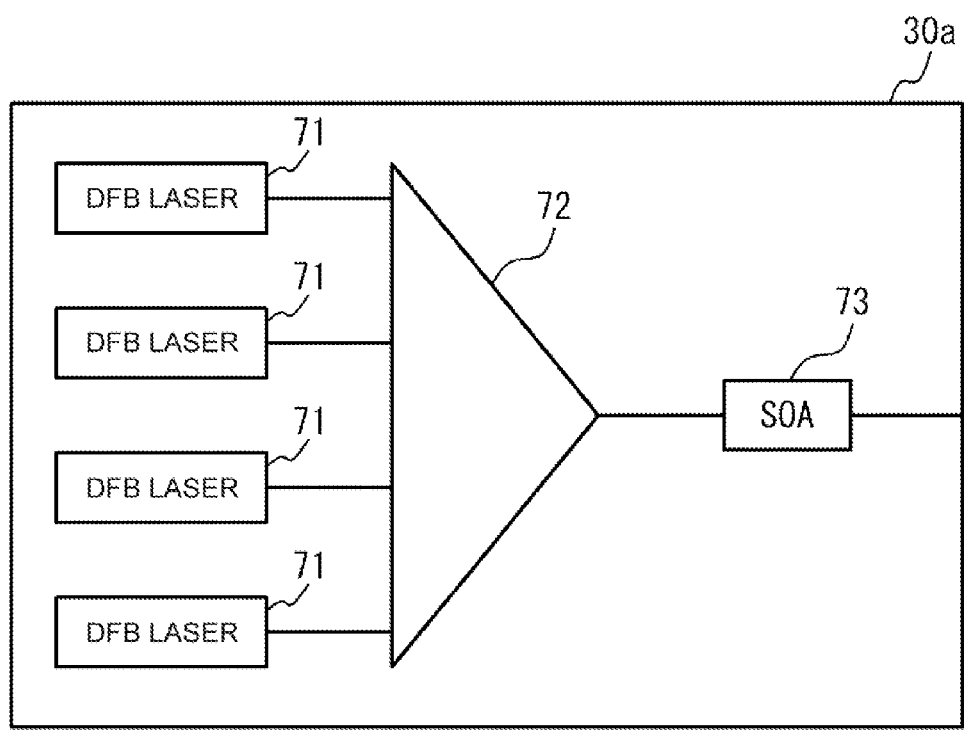
FIG. 10 discloses another example of a laser device.

FIG. 10 discloses another example of a laser device that can be replaced with the semiconductor laser 30. As shown in FIG. 10, a laser module 30a has plural DFB lasers 71, an optical coupler 72, and an optical amplifier 73. The DFB lasers 71 differ from each other in corrugation pitch, and in some cases, differ from each other in semiconductor material of the active layer therein. Owing to such a configuration, the DFB lasers 71 can emit laser beams of different lasing wavelengths in the same temperature/driving current. The output of each DFB laser 71 is coupled to the optical coupler 72. The optical coupler 72 guides the incident light to the optical amplifier 73. The optical amplifier 73 amplifies the incident light and provides the amplified version of the incident light to the outside. In the selection of an output wavelength, one of the DFB lasers 71 that covers the bandwidth of a target wavelength is selected first. Then, the temperature of the selected DFB laser 71 is controlled by means of the first temperature control device 31, thereby realizing the desired lasing wavelength. Thus, the laser module 30a has a number of the DFB lasers 71 that are prepared enough to provide the entire wavelength bandwidth required by the laser module 30a. The DFB lasers 71 that are not selected are not fed with driving power and therefore turned off.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A method for controlling a wavelength tunable laser having a temperature controller to control a waveguide therein comprising:
    a first step of acquiring a first driving condition from a memory including an information of the temperature controller, the first driving condition relating to a condition to drive the laser in a first wavelength;
    a second step of calculating a second driving condition using the first driving condition and a wavelength difference between the first wavelength and a second wavelength different from the first wavelength, the calculation being executed in a condition that the temperature of the temperature controller in the second driving condition is equal to or lower than the temperature of the temperature controller in the first driving condition; and
    a third step of driving the wavelength tunable laser based on the second driving condition calculated in the second step.

2. The method according to claim 1, wherein the first step includes a step of selecting the first wavelength in a condition that the second wavelength is achieved by controlling the temperature of the temperature controller in the second driving condition to be equal to or lower than the temperature of the temperature controller in the first driving condition.

3. The method according to claim 1, wherein a temperature of the wavelength tunable laser is controlled by a temperature control device including a Peltier element.

4. The method according to claim 1, wherein the wavelength tunable laser includes an array laser having plural DFB lasers.

5. The method according to claim 1, wherein the wavelength tunable laser includes a SG-DFB.

6. A method for controlling a wavelength tunable laser having a temperature controller to control a waveguide therein comprising:
    a first step of acquiring a first driving condition from a memory including an information of the temperature controller, the first driving condition relating to a condition to drive the laser in a first wavelength;
    a second step of calculating a second driving condition using the first driving condition and a wavelength difference between the first wavelength and a second wavelength different from the first wavelength, the calculation being executed in a condition that the temperature of the temperature controller in the second driving condition is equal to or higher than the temperature of the temperature controller in the first driving condition; and
    a third step of driving the wavelength tunable laser based on the second driving condition calculated in the second step.

7. The method according to claim 6, wherein the first step includes a step of selecting the first wavelength in a condition that the second wavelength is achieved by controlling the temperature of the temperature controller in the second driving condition to be equal to or higher than the temperature of the temperature controller in the first driving condition.

8. The method according to claim 6, wherein a temperature of the wavelength tunable laser is controlled by a temperature control device including a Peltier element.

9. The method according to claim 6, wherein the wavelength tunable laser includes an array laser having plural DFB lasers.

10. The method according to claim 6, wherein the wavelength tunable laser includes a SG-DFB.

* * * * *